United States Patent [19]

Schoessow

[11] Patent Number: 5,661,733
[45] Date of Patent: Aug. 26, 1997

[54] AUTOMATIC TEST INSERTION

[75] Inventor: Stephen J. Schoessow, Playa del Rey, Calif.

[73] Assignee: Hughes Electronics, Los Angeles, Calif.

[21] Appl. No.: 630,185

[22] Filed: Apr. 10, 1996

[51] Int. Cl.$^6$ .................................................. G06F 11/00
[52] U.S. Cl. .................................. 371/22.31; 364/489
[58] Field of Search .............................. 371/22.3, 22.1, 371/23, 27, 28; 364/489, 490, 488

[56] References Cited

U.S. PATENT DOCUMENTS

| | | | |
|---|---|---|---|
| 5,463,562 | 10/1995 | Theobald | 364/489 |
| 5,513,188 | 4/1996 | Parker et al. | 371/22.3 |
| 5,612,891 | 3/1997 | Butts et al. | 364/489 |

*Primary Examiner*—Vincent P. Canney
*Attorney, Agent, or Firm*—Leonard A. Alkov; Wanda K. Denson-Low

[57] ABSTRACT

A method of inserting automatic test logic into a synthesized logic circuit. The method operates in two phases using a synthesized netlist of the logic circuit as an input. The first phase uses outputs of a fault grading tool, and alters the netlist to incorporate fault grading logic additions such as flip-flops to provide control and observation points within the logic circuit and gate modifications dictated by the fault grading tool. The second phase adds scan structures to the synthesized logic circuit using parameters such as the number and length of scan chains determined by a user. Buffering associated with scan hook-up and scan mode lines is determined and distributed buffering is then added to the netlist to output a modified output netlist. The resultant synthesized logic circuit defined by the modified output netlist is functionally identical (when not in scan mode) to the original design, but has test insertion logic added to it, and thus includes a high fault grade percentage and scan logic functions.

12 Claims, 3 Drawing Sheets

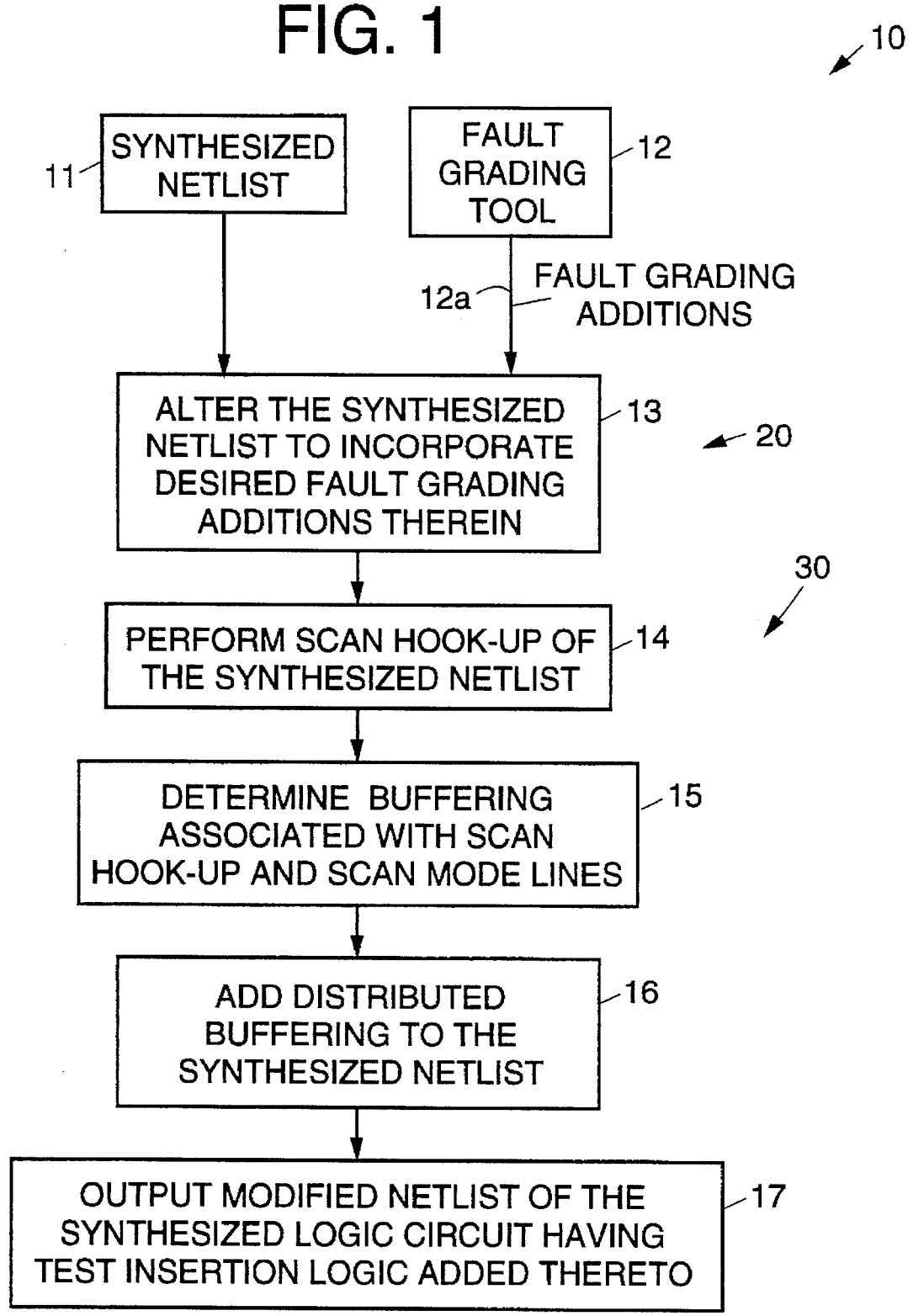

AUTOMATIC TEST INSERTION

BACKGROUND

The present invention generally relates to test methods for synthesized logic circuits, and more particularly, to a method for automatically inserting test logic into synthesized logic circuits.

In the past, it has been the general practice for engineers to manually add or insert test logic into synthesized logic circuits, such as an application specific integrated circuit (ASIC) generated using a logic synthesizer. However, if the structure of the logic circuit changed, the logic synthesizer would be used to generate new logic and the engineer would again manually reinsert test logic functions into the new logic circuit. Because many manufacturers of custom ASICs use their own unique methods testing, CAD tools normally do not automatically support fault grading or the creation of test insertion logic.

Therefore, it is an objective of the present invention to provide for a test logic insertion method for use in designing synthesized logic circuits.

SUMMARY OF THE INVENTION

To meet the above and other objectives, the present invention provides for a computer-implemented method for automatically inserting test logic into synthesized logic circuits. The present invention provides a method that may be used to enhance existing CAD tools and peats the development of additional tools that complement test-related software tools.

More specifically the present computer-implemented method corresponds to and may be embodied in a computer program, such as one that may be written in the C programming language, for example. The computer-implemented method or program operates in two phases using a synthesized netlist of the logic circuit as an input. The first phase uses outputs of a fault grading tool, and modifies the netlist to incorporate desired fault grading logic additions. The fault grading additions include flip-flops to provide control and observation points within the logic circuit and gate modifications to the logic circuit that are required and dictated by the fault grading tool. The second phase adds scan structures to the synthesized logic circuit using parameters such as the number and length of scan chains determined by a user. Buffering associated with scan hook-up and scan mode lines is determined and distributed buffering is then added to the netlist of the synthesized logic circuit. The resultant design of the synthesized logic circuit is functionally identical to the original design (when not in scan mode), but has test insertion logic added to it, and thus the modified logic includes a high fault grade percentage and scan capabilities.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 1 illustrates a top level flow diagram of an automatic test insertion method in accordance with the principles of the present invention for use in generating synthesized logic.

DETAILED DESCRIPTION

Figure 2A:
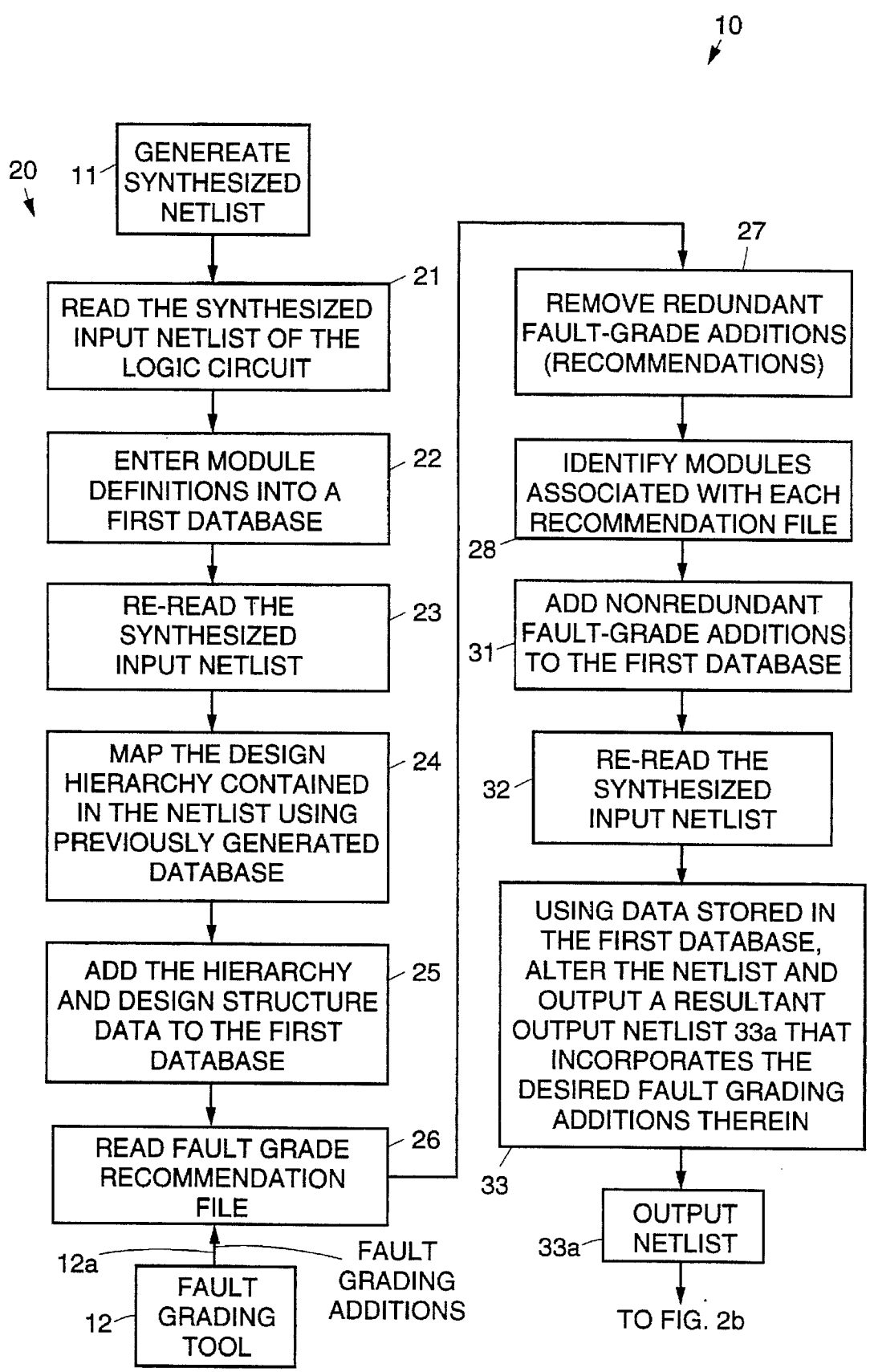
FIGS. 2a and 2b illustrate a detailed flow diagram of the automatic test insertion method shown in FIG. 1.

Referring to the drawing figures, FIG. 1 shows a top level flow diagram of an automatic test insertion method 10 in accordance with the principles of the present invention. The automatic test insertion method 10 is used to inserting automatic test logic into a synthesized logic circuit. The synthesized logic circuit may be an application specific integrated circuit, or other custom integrated circuit, for example.

The present automatic test logic insertion method 10 corresponds to and may be embodied in a program 10 that implemented in the C programming language, for example. The method 10 or program 10 works in first and second phases 20, 30 and uses a synthesized netlist 11 of the logic circuit as an input.

The first phase 20 uses results of a fault grading tool 12, such as may be provided by a FASTSCAN program available from Mentor Graphics, or other fault grading tool 12, and alters 13 the synthesized netlist 11 to incorporate desired fault grading additions therein. The fault grading additions include adding flip-flops to provide control and observation points within the circuit and gate modifications to the circuit that are required and dictated by the fault grading tool 12.

The second phase 30 performs 14 scan hook-up of the synthesized logic circuit using parameters such as the number and length of scan chains as determined by a user. Other parameters may include scan chain order, and flip flop type, and the like, as is well known to those skilled in the art. Scan hook-up refers to interconnecting flip flops into scan chain structures. The method 10 determines 15 all required buffering associated with scan hook-up and scan mode lines and then distributed buffering is added 16 to the synthesized netlist of 11 the synthesized logic circuit. Scan mode lines are for control during scan mode versus normal mode of operation. The method 10 then outputs 17 a modified netlist having test insertion logic added thereto. The resultant design of the synthesized logic circuit is functionally identical to the original design, but has test insertion logic added, and thus provides fault grade percentage and scan capabilities.

Thus, to summarize the present invention, in its broadest form, it is a method 10 for automatically inserting test logic into a synthesized logic circuit that comprises the following steps. A synthesized netlist 11 of the logic circuit is input to the method 10. Fault grading logic additions 12a that are to be added to the synthesized logic circuit are generated using a fault grading tool 12. The synthesized netlist 11 is modified 13 to incorporate the desired fault grading logic additions in the synthesized logic circuit derived from outputs of the fault grading tool 12. Scan hook-up is performed on the synthesized logic circuit using logic parameters determined by a user, and are added 14 to the synthesized netlist. Buffering associated with scan hook-up and scan mode lines of the synthesized logic circuit is determined 15. Distributed buffering is added 16 to the netlist of the synthesized logic circuit. A modified netlist is output 17 that incorporates the test insertion logic. The resultant synthesized logic circuit has test insertion logic incorporated therein that includes fault grade percentage and scan capabilities defined by the fault grading logic additions and distributed buffering added to the netlist, respectively. The fault grade results predicted by the fault grade tool are produced if all recommendations of the fault grade tool were added to the netlist.

A reduced-to-practice embodiment of the method 10 embodied in a C language program was written with recursive procedures so that it processes the design netlist 11 without restrictions as to structure, levels of hierarchy, or size of the netlist 11. The method 10 inserts automated test logic into the synthesized logic circuit in less than a minute of run time for a circuit having a complexity of 15,000 gates, for example.

Figure 2B:
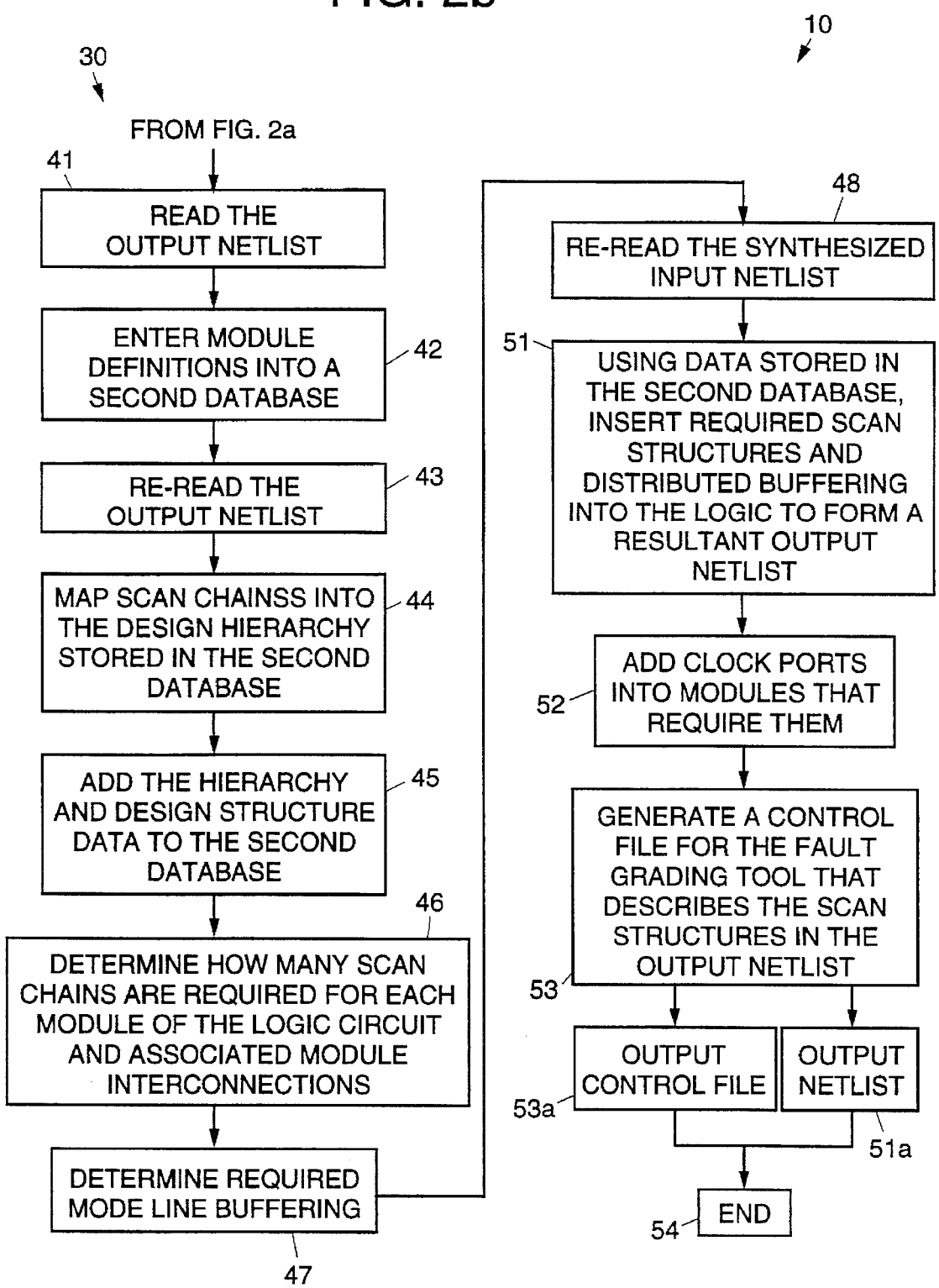

Referring now to FIGS. 2a and 2b, they illustrate a detailed flow diagram of a reduced-to-practice method 10 of the present invention. With reference to FIGS. 2a and 2b, the method 10 is broken into first (FIG. 2a) and second (FIG. 2b) phases 20, 30, and each phase 20, 30 has sub-phases or substeps that are performed in the manner discussed below.

Referring to FIG. 2a, the synthesized input netlist 11 corresponding to the logic circuit is generated 21. In the first phase 20, the synthesized input netlist of the synthesized logic circuit is read 21 and module definitions are entered 22 into a first database. The synthesized input netlist is then re-read 23 and its design hierarchy is mapped 24 using previously-generated data stored in the first database. This hierarchy and design structure data is then added 25 to the first database.

The grading tool 12 is provided, and fault grading logic additions comprising fault grade percentage logic are generated 12a using the fault grading tool 12. In particular, a fault grade recommendation file is read 26 from the fault grading tool 12, such as from the FASTSCAN fault grading tool 12. Redundant fault-grade additions or recommendations are then removed 27 and modules associated with the recommendation file of the fault grading tool 12 are identified 28. The nonredundant fault-grade recommendations of the fault grade tool 12 which comprise an observe and control node list is added 31 into the first database to provide for observation points in the logic circuit. The synthesized input netlist 11 is then re-read 32, and using data stored in the first database, the netlist is altered 33 or modified 33 to form a resultant output netlist 33a containing the fault grade recommendations. This output netlist 33a is output for processing by the second phase 30. The steps of re-reading 32 the synthesized input netlist 11 and then altering 33 the netlist to form a resultant output netlist 33a are performed concurrently, which therefore does not limit the size of the output netlist 33a.

Referring to FIG. 2b, in the second phase 30, the output netlist 33a is read 41 and module definitions are entered 42 into a second database. The output netlist 33a is then re-read 43 and scan chains are mapped 44 into the design hierarchy stored in the second database. The design hierarchy and design structure data are added 45 to the second database. The number of scan chains that are required for each module of the logic circuit and associated module interconnections are then determined 46. Any required mode line buffering is determined 47.

The synthesized input netlist is re-read 48, and using the data stored in the second database, all required scan structures and distributed buffering are inserted 51 into the logic and clock ports are added 52 into modules that require them to form a resultant output netlist 51a. A control file 53a for the fault grading tool 12 is generated 53 that describes the scan structures in the output netlist 51a. The control file may be used by the fault grading tool 12 to verify fault grade percentage and verify scan structure topology and correctness. The method 10 then ends 54.

In the second phase 30, the steps of re-reading 48 the synthesized input netlist 11, altering 51 the netlist to form the output netlist 51 a and control file 53a are performed concurrently, which does not limit the size of the output netlist 33a. The present method 10 outputs the altered output netlist 51a while reading in the input netlist. Therefore, the method 10 is not required to hold very much of the input netlist at one time, which minimizes the required memory capacity. Furthermore, the concurrent reading and output steps along with the recursive nature of the database structure allows the present method 10 to circumvent most conventional netlist length and hierarchy limits. In addition, this recursive processing performed by the present method makes it very fast, since it is not required to operate with large databases.

Thus, a method of inserting automatic test logic into a synthesized logic circuit has been disclosed. It is to be understood that the described embodiment is merely illustrative of some of the many specific embodiments which represent applications of the principles of the present invention. Clearly, numerous and varied other arrangements may be readily devised by those skilled in the art without departing from the scope of the invention.

What is claimed is:

1. A method for automatically inserting test logic into a synthesized logic circuit, said method comprising the steps of:

inputting a synthesized netlist of the logic circuit;

generating fault grading logic additions to be added to the synthesized logic circuit using a fault grading tool;

modifying the synthesized netlist using outputs of the fault grading tool to incorporate the desired fault grading logic additions in the synthesized logic circuit;

performing scan hook-up of the synthesized logic circuit using logic parameters determined by a user;

determining buffering associated with scan hook-up and scan mode lines of the synthesized logic circuit; and adding distributed buffering to the netlist of the synthesized logic circuit;

whereby the resultant synthesized logic circuit has test insertion logic incorporated therein that includes fault grade percentage and scan capabilities defined by the fault grading logic additions and distributed buffering added to the netlist, respectively.

2. The method of claim 1 wherein the step of modifying the synthesized netlist comprises adding flip-flops to provide control and observation points within the logic circuit.

3. The method of claim 1 wherein the step of modifying the synthesized netlist comprises adding gate modifications to the logic circuit that are required and dictated by the fault grading tool.

4. The method of claim 1 wherein the logic parameters comprise the number and length of scan chains.

5. The method of claim 1 wherein the fault grading logic additions comprise fault grade percentage logic.

6. A method for automatically inserting test logic into a synthesized logic circuit, said method comprising the steps of:

generating a synthesized netlist corresponding to the logic circuit;

reading the synthesized netlist of the logic circuit;

providing a fault grading tool;

generating fault grading logic additions using the fault grading tool;

modifying the synthesized netlist to incorporate the fault grading logic additions therein;

adding scan structures to the synthesized netlist;

determining buffering associated with scan hook-up and scan mode lines;

adding distributed buffering to the synthesized netlist; and outputting a modified netlist of the synthesized logic circuit having test insertion logic added thereto.

7. The method of claim 6 further comprising the step of:

generating the synthesized logic circuit using the modified synthesized netlist to provide a synthesized logic circuit having test insertion logic, fault grade percentage logic, and scan logic incorporated therein.

8. The method of claim 6 wherein the step of altering the netlist comprises adding flip-flops to provide control and observation points within the logic circuit.

9. The method of claim 6 wherein the step of altering the netlist comprises adding gate modifications to the logic circuit that are required and dictated by the fault grading tool.

10. The method of claim 6 wherein the predetermined logic parameters comprise the number and length of scan chains.

11. The method of claim 6 wherein the fault grading logic additions comprise fault grade percentage logic.

12. A method of automatically inserting test logic into a synthesized logic circuit, said method comprising the steps of:

generating a synthesized input netlist corresponding to the logic circuit;

reading the synthesized netlist of the logic circuit;

entering module definitions, into first database;

re-reading the synthesized input netlist;

mapping a design hierarchy contained in the synthesized input netlist using module definitions;

adding the design hierarchy and design structure data to the first database;

providing a fault grading tool;

generating fault grading logic additions comprising fault grade percentage logic using the fault grading tool;

reading a fault grade recommendation file from the fault grading tool;

removing redundant fault grade additions;

identifying modules associated with each recommendation file of the fault grading tool;

adding nonredundant fault grade additions comprising an observe and control node list into the first database;

re-reading the synthesized input netlist;

using data stored in the first database, modifying the synthesized netlist to form a resultant output netlist containing the fault grade recommendations provided by the fault grading tool;

reading the synthesized output netlist;

entering module definitions into a second database;

re-reading the output netlist;

mapping scan chains into the design hierarchy stored in the second database;

determining how many scan chains are required for each module of the logic circuit and associated module interconnections;

determining required mode line buffering;

re-reading the synthesized input netlist;

using the data stored in the second database, inserting required scan structures and distributed buffering into the logic and adding clock ports into modules that require them to form a resultant output netlist; and generating a control file for the fault grading tool that describes the scan structures in the output netlist, wherein the control file is used by the fault grading tool to verify fault grade percentage and verify scan structure topology and correctness.

* * * * *